(12) United States Patent
Kurusu

(10) Patent No.: US 9,238,256 B2
(45) Date of Patent: Jan. 19, 2016

(54) SUBSTRATE PROCESSING SCRUBBER, SUBSTRATE PROCESSING APPARATUS AND SUBSTRATE PROCESSING METHOD

(71) Applicant: Tokyo Electron Limited, Tokyo (JP)

(72) Inventor: Kento Kurusu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 196 days.

(21) Appl. No.: 13/760,249

(22) Filed: Feb. 6, 2013

(65) Prior Publication Data

US 2013/0206171 A1    Aug. 15, 2013

(30) Foreign Application Priority Data

Feb. 9, 2012  (JP) ................................ 2012-026502
Sep. 18, 2012 (JP) ................................ 2012-203859

(51) Int. Cl.
  B08B 1/00    (2006.01)
  B08B 1/04    (2006.01)
  H01L 21/02   (2006.01)
  H01L 21/67   (2006.01)
  H01L 21/304  (2006.01)

(52) U.S. Cl.
  CPC . B08B 1/002 (2013.01); B08B 1/04 (2013.01); H01L 21/02074 (2013.01); H01L 21/304 (2013.01); H01L 21/67046 (2013.01); H01L 21/67051 (2013.01)

(58) Field of Classification Search
  CPC ............ H01L 21/304; H01L 21/67046; H01L 21/67051; B08B 1/002; B08B 1/04
  USPC .......................... 134/6, 56 R, 902; 15/230.16
  See application file for complete search history.

(56) References Cited

U.S. PATENT DOCUMENTS

2005/0118938 A1 *  6/2005  Mizomoto et al. .............. 451/65
2011/0130002 A1 *  6/2011  Bankaitis et al. ............. 438/692

FOREIGN PATENT DOCUMENTS

JP       2011-206867 A    10/2011

* cited by examiner

Primary Examiner — Joseph L Perrin
Assistant Examiner — Levon J Shahinian
(74) Attorney, Agent, or Firm — Pearne & Gordon LLP

(57) ABSTRACT

A removal target can be effectively removed from a substrate. In a substrate processing apparatus 1 and a substrate processing method by using a substrate processing scrubber 29 of removing the removal target from the substrate 5, the substrate processing scrubber 29 includes a base 31 connected to a rotation shaft 28; scrubber main bodies 32 provided at the base 31 and arranged at a regular distance in a rotational direction of the base 31; and a processing liquid supply opening 36 formed at the base 31 and configured to supply a processing liquid to the scrubber main bodies 32. Further, an area of an attachment surface of each of the scrubber main bodies 32 to be attached to the base 31 is larger than an area of a contact surface of each of the scrubber main bodies 32 to be brought into contact with the substrate 5.

11 Claims, 6 Drawing Sheets (a)

(c)

(b)

SUBSTRATE PROCESSING SCRUBBER, SUBSTRATE PROCESSING APPARATUS AND SUBSTRATE PROCESSING METHOD

CROSS-REFERENCE TO RELATED APPLICATION

This application claims the benefit of Japanese Patent Application Nos. 2012-026502 and 2012-203859 filed on Feb. 9, 2012 and Sep. 18, 2012, respectively, the entire disclosures of which are incorporated herein by reference.

FIELD OF THE INVENTION

The present disclosure relates to a substrate processing scrubber configured to remove a removal target from a substrate and also relates to a substrate processing apparatus and a substrate processing method.

BACKGROUND OF THE INVENTION

When conventionally manufacturing a semiconductor device, a flat panel display, or the like, various processes such as an etching process, a film forming process and a cleaning process are repeatedly performed on a front surface (main surface: circuit forming surface) of a substrate such as a semiconductor wafer or a liquid crystal substrate while the substrate is held by a substrate holding device.

When performing such various processes on the substrate, contaminants such as particles may adhere to a rear surface of the substrate, or protrusions may be formed on the rear surface of the substrate. These contaminants adhering to the rear surface of the substrate or the protrusions formed on the rear surface of the substrate may have adverse effect on the various processes for the substrate.

For the reason, by pressing and rotating a substrate processing scrubber against the rear surface of the substrate, such a cleaning process or a polishing process is performed on the rear surface of the substrate. Thus, the removal target such as the contaminants or the protrusions is removed from the rear surface of the substrate. This substrate processing scrubber includes a base connected to a rotation shaft; and a multiple number of scrubber main bodies annularly arranged on the base along a rotational direction of the base (see, for example, Patent Document 1).

Patent Document 1: Japanese Patent Laid-open Publication No. 2011-206867

As for such a conventional substrate processing scrubber, however, when removing the removal target from the substrate, the scrubber main bodies that are separately provided are rotated while being pressed against the rear surface of the substrate. Accordingly, the separate scrubber main bodies may be inclined against the substrate by a repulsive force applied from the substrate. As a result, it is difficult to effectively eliminate the removal target from the substrate.

BRIEF SUMMARY OF THE INVENTION

In accordance with one aspect of an illustrative embodiment, there is provided a substrate processing scrubber of removing a removal target from a substrate. The substrate processing scrubber includes a base connected to a rotation shaft; scrubber main bodies provided at the base and arranged at a regular distance in a rotational direction of the base; and a processing liquid supply opening formed at the base and configured to supply a processing liquid to the scrubber main bodies. An area of an attachment surface of each of the scrubber main bodies to be attached to the base is larger than an area of a contact surface of each of the scrubber main bodies to be brought into contact with the substrate.

The base may include a base body connected to the rotation shaft; and a buffer body provided between the base body and each of the scrubber main bodies. Further, the base body may be made of a rigid material and the buffer body may be made of an elastic material having lower rigidity than that of the scrubber main bodies.

Each of the scrubber main bodies may have an outer periphery and an inner periphery each having a downwardly protruding shape. Further, the contact surface of each of the scrubber main bodies may be formed at the outer periphery and the inner periphery, and a non-contact surface of each of the scrubber main bodies not to be brought into contact with the substrate may be formed between the inner periphery and the outer periphery.

An area of the non-contact surface of each of the scrubber main bodies may be larger than that of the contact surface thereof.

Liquid drain grooves configured to discharge the processing liquid may be formed between adjacent scrubber main bodies in the scrubber main bodies.

Each of the liquid drain grooves may be formed from a rotation center of the base toward an outer peripheral portion thereof in a radial direction.

A width of each of the liquid drain grooves may be increased from a rotation center of the base toward an outer peripheral portion thereof.

Each of the liquid drain grooves may be curved in the rotational direction of the base.

In accordance with another aspect of the illustrative embodiment, there is provided a substrate processing apparatus of removing a removal target from a substrate by using a substrate processing scrubber that is rotated. The substrate processing scrubber includes a base connected to a rotation shaft; scrubber main bodies provided at the base and arranged at a regular distance in a rotational direction of the base; and a processing liquid supply opening formed at the base and configured to supply a processing liquid to the scrubber main bodies. Further, an area of an attachment surface of each of the scrubber main bodies to be attached to the base is larger than an area of a contact surface of each of the scrubber main bodies to be brought into contact with the substrate.

An outer peripheral end of the substrate may be supported by a substrate supporting body extended along the outer peripheral end of the substrate.

The substrate processing apparatus may further include a processing liquid supply device configured to supply the processing liquid from the processing liquid supply opening; and a controller configured to control a flow rate of the processing liquid supplied from the processing liquid supply device. Further, the controller may be configured to control the processing liquid supply device such that a flow rate of the processing liquid when processing an outer region of the substrate with the substrate processing scrubber is smaller than a flow rate of the processing liquid when processing an inner region of the substrate with the substrate processing scrubber.

In accordance with still another aspect of the illustrative embodiment, there is provided a substrate processing method of removing a removal target from a substrate by using a substrate processing scrubber that is rotated. The method includes bringing the substrate processing scrubber into contact with the substrate, the substrate processing scrubber including a base and scrubber main bodies provided at the base in a rotational direction of the base while an area of an attachment surface of each of the scrubber main bodies to be attached to the base is larger than an area of a contact surface of each of the scrubber main bodies to be brought into contact with the substrate; supplying a processing liquid from the base to the scrubber main bodies; and discharging the processing liquid through liquid drain grooves formed between adjacent scrubber main bodies in the scrubber main bodies.

A flow rate of the processing liquid supplied to the scrubber main bodies when processing an outer region of the substrate with the substrate processing scrubber may be smaller than a flow rate of the processing liquid when processing an inner region of the substrate with the substrate processing scrubber.

In accordance with the illustrative embodiment, even when the substrate processing scrubber is rotated and pressed against the substrate to remove the removal target, the scrubber main bodies can be prevented from being inclined against the substrate by a repulsive force applied from the substrate. Thus, the removal target can be effectively removed from the substrate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described with reference to the accompanying drawings. In the following, the illustrative embodiments will be described for a substrate processing apparatus configured to polish a rear surface of a substrate with a substrate processing scrubber. However, the illustrative embodiments are not limited to polishing the substrate but may also be applicable to various other processes such as a cleaning process for cleaning the substrate by using the substrate processing scrubber.

Figure 1:
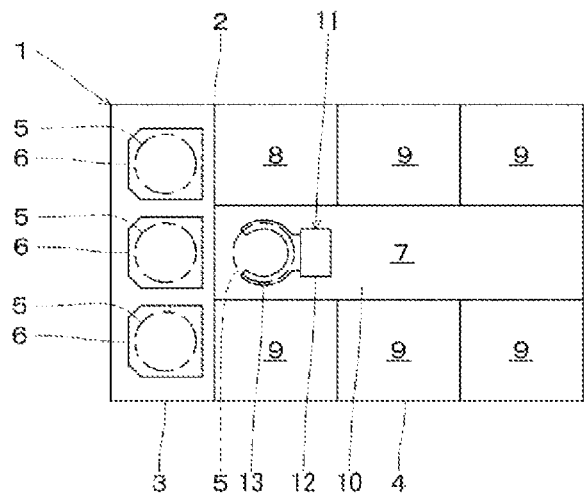
FIG. 1 is a plane view illustrating a substrate processing apparatus.

As illustrated in FIG. 1, a substrate processing apparatus 1 includes a substrate loading/unloading table 3 located in a front end of a housing 2, and a substrate processing chamber 4 is provided at a rear side of the substrate loading/unloading table 3.

The substrate loading/unloading table 3 mounts thereon a multiple number of (here, three) carriers 6 side by side in a left-right direction. Each carrier 6 accommodates therein a multiple number of (e.g., 25 sheets) substrates 5 (here, semiconductor wafers).

The substrate loading/unlading table 3 is configured to load and unload the substrates 5 between the carrier 6 and the substrate processing chamber 4 at the rear side.

In the substrate processing chamber 4, a substrate transfer unit 7 is provided at a central portion thereof. A substrate reversing unit 8 and two substrate processing units 9 are arranged side by side at one lateral side of the substrate transfer unit 7, and three substrate processing units 9 are arranged side by side at the other lateral side of the substrate transfer unit 7.

The substrate transfer unit 7 includes a substrate transfer device 11 extended in a forward-backward direction within a transfer chamber 10. The substrate transfer device is configured to hold and transfer the substrates 5 thereon one by one.

The substrate transfer device 11 includes a moving table 12 configured to move back and forth; and an arm 13 configured to hold thereon a single sheet of the substrate 5. The arm 13 is provided at the moving table 12, and is capable of moving back and forth, moving up and down, and rotating.

The substrate transfer device 11 is also configured to transfer the substrates 5 one by one between the substrate loading/unloading table 3 and the substrate reversing unit 8 or between the substrate reversing unit 8 and the substrate processing units 9.

Within the substrate processing chamber 4, the substrate transfer device 11 receives a single sheet of the substrate 5 from a certain carrier 6 of the substrate loading/unloading table 3 while a front surface (main surface: circuit forming surface) of the substrate 5 faces upward. Then, the substrate transfer device 11 transfers the substrate 5 into the substrate reversing unit 8. In the substrate reversing unit 8, the substrate 5 is reversed upside down. Thereafter, the substrate transfer device 11 receives the substrate 5 from the substrate reversing unit 8 while a rear surface of the substrate 5 faces upward, and then transfers the substrate 5 into a certain substrate processing unit 9. In the substrate processing unit 9, the rear surface of the substrate 5 is polished. After completing the polishing process, the substrate transfer device 11 transfers the substrate 5 from the substrate processing unit 9 into the substrate reversing unit 8. In the substrate reversing unit 8, the substrate 5 is turned upside down, again. Then, the substrate transfer device 11 receives the substrate 5 from the substrate reversing unit 8 while the front surface of the substrate 5 faces upward, and transfers the substrate 5 into the certain carrier 6 of the substrate loading/unloading table 3.

The substrate reversing unit 8 is configured to turn the substrate 5 received from the substrate transfer device 11 upside down.

Figure 2:
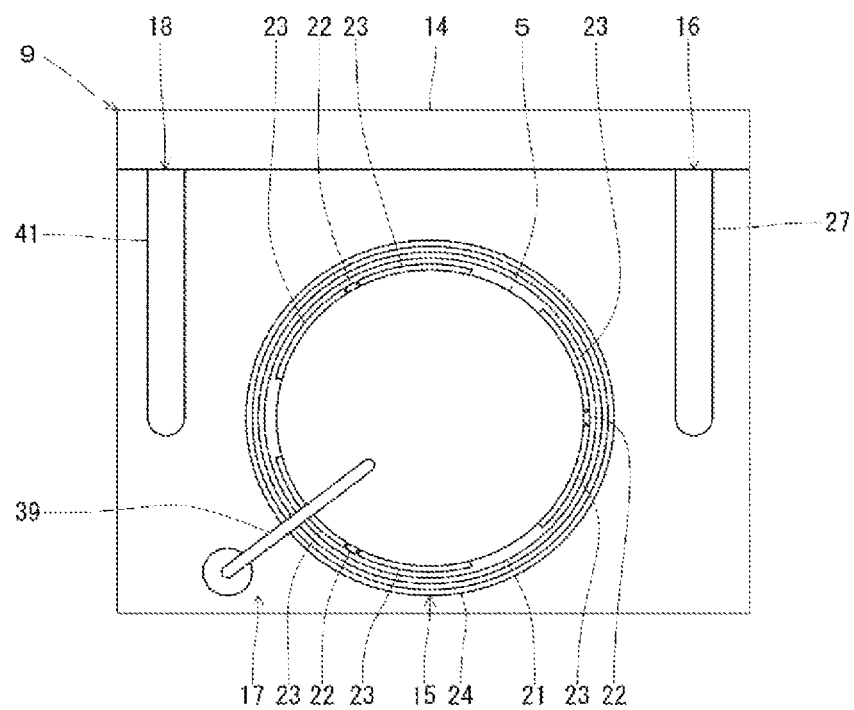
FIG. 2 is a plane view illustrating a substrate processing unit.
Figure 3:
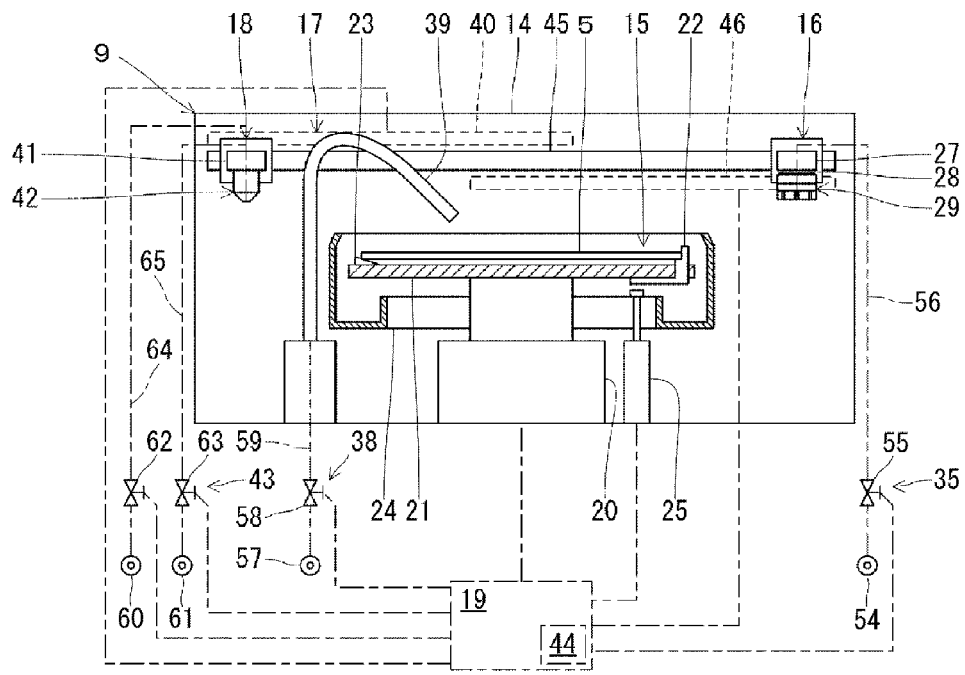
FIG. 3 is a front view illustrating the substrate processing unit.

As depicted in FIGS. 2 and 3, the substrate processing unit 9 includes, in a casing 14, a substrate holding unit 15, a substrate polishing unit 16, a rinse liquid supply unit 17 and a substrate cleaning unit 18. The substrate holding unit 15 is configured to hold and rotate the substrate 5 thereon. The substrate polishing unit 16, serving as a substrate processing device for processing the substrate 5, is configured to polish the rear surface of the substrate 5. The rinse liquid supply unit 17 is configured to supply a rinse liquid (pure water) onto the rear surface of the substrate 5 during the polishing process. The substrate cleaning unit 18 is configured to clean the rear surface of the substrate 5 after the polishing process. The substrate holding unit 15, the substrate polishing unit 16, the rinse liquid supply unit 17 and the substrate cleaning unit 18 are connected to and controlled by a controller 19. The controller 19 may also control the substrate transfer unit 7 and the substrate reversing unit 8 as well as the substrate processing unit 9.

The substrate holding unit 15 includes a rotation driving device 20 provided within the casing 14; and a circular plate-shaped turntable 21 horizontally connected to the rotation driving device 20. Three substrate holding bodies 22 for holding an outer peripheral end of the substrate 5 are arranged at a peripheral end of the turntable 21 at a regular distance along a circumference of the turntable 21. The substrate holding bodies 22 are configured to be opened and closed. Further, substrate supporting bodies 23 for holding the outer peripheral end of the substrate 5 are provided at left and right sides of each substrate holding body 22, respectively. Each substrate supporting body 23 is formed as an inclined surface extended in a circular arc shape along the outer peripheral end of the substrate 5. Further, the outer periphery of the turntable 21 is surrounded by a cup 24. The substrate holding bodies 22 are opened and closed by an opening/closing device 25. The rotation driving device 20 and the opening/closing device 25 are connected to and controlled by the controller 19.

Figure 4:
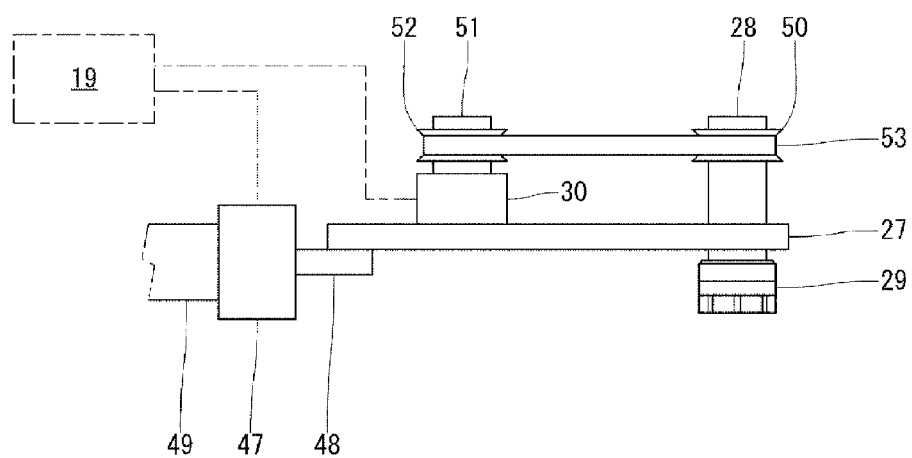
FIG. 4 is a side view illustrating a substrate polishing unit.

As illustrated in FIGS. 3 and 4, the substrate polishing unit 16 includes an arm 27 disposed above the substrate 5. The arm 27 is configured to be movable along a straight line-shaped guide rail 45 that is extended within the casing 14 in a substantially horizontal manner. A scan driving device 46 configured to move the arm 27 in a substantially horizontal manner is connected to the arm 27. The scan driving device 46 may include, for example, a ball screw; and a motor configured to rotate the ball screw. By operating the scan driving device 46, the arm 27 can be moved above the substrate 5 held on the substrate holding unit 15. The scan driving device 46 is connected to and controlled by the controller 19.

The arm 27 is connected to an arm elevation driving device 47 configured to move the arm 27 up and down with respect to the substrate 5 held on the substrate holding unit 15. The arm elevation driving device 47 may be formed by, for example, a cylinder. The arm elevation driving device 47 and the arm 27 are connected to each other via a first connection member 48. The arm elevation driving device 47 and the scan driving device 46 are connected to each other via a second connection member 49. The arm 27 is configured to be movable along the guide rail 45 together with the first connection member 48, the arm elevation driving device 47 and the second connection member 49. The arm elevation driving device 47 is connected to and controlled by the controller 19.

Further, in the substrate polishing unit 16, a vertically extended rotation shaft 28 is rotatably provided at a front end of the arm 27, and a polishing scrubber 29 as a substrate processing scrubber is provided at a lower end of the rotation shaft 28. A driven pulley 50 is provided at the rotation shaft 28. Further, a scrubber rotation driving device 30 is disposed on the arm 27, and a driving pulley 52 is provided at a driving shaft 51 of the scrubber rotation driving device 30. The scrubber rotation driving device 30 may be formed by, for example, a motor. A belt 53 is wound between the driving pulley 52 and the driven pulley 50. Accordingly, a rotational driving force of the scrubber rotation driving device 30 is transmitted to the rotation shaft 28 via the belt 53. Thus, the polishing scrubber 29 can be rotated. The scrubber rotation driving device 30 is connected to and controlled by the controller 19.

Figure 5:
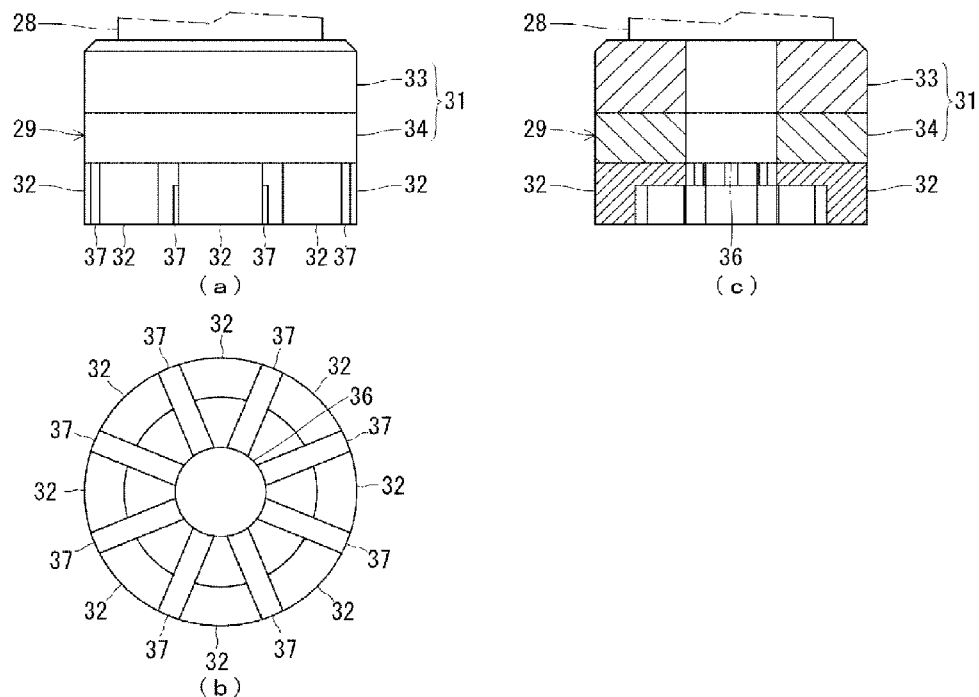
FIG. 5 provides a front view (a), a bottom view (b) and a cross sectional view (c) illustrating a substrate processing scrubber.

The polishing scrubber 29 includes, as depicted in FIG. 5, a cylindrical base 31 detachably provided at the rotation shaft 28; and a multiple number of (here, eight) polishing members 32 provided at a lower portion of the base 31 at a regular distance along a rotational direction of the rotation shaft 28. Each of the polishing members 32 serves as a scrubber main body and is made of a grindstone (which may be formed by adding silicon carbide, diamond or the like to a base material such as polyvinyl alcohol or phenolic resin). The base 31 includes a cylindrical base body 33 connected to the rotation shaft 28; and a cylindrical buffer body 34 provided at a lower portion of the base body 33. The base body 33 is made of a rigid material such as metal or resin, while the buffer body 34 is made of an elastic material such as silicon rubber, polyolefin sponge or polyurethane. That is, the buffer body 34 having lower rigidity than the polishing members 32 is provided between the respective polishing members 32 and the base body 33. With this configuration, even if the substrate 5 is deformed, the buffer body 34 connected to the polishing members 32 may be deformed along the deformation of the substrate 5. Accordingly, the polishing members 32 are allowed to appropriately move along a processing target surface of the substrate 5.

Here, each polishing member 32 is formed such that an outer periphery thereof protrudes downward. That is, the polishing member 32 has a reversed L-shaped cross sectional shape, and a contact surface to be brought into contact with the substrate 5 is formed at the outer periphery of the polishing member 32 and a non-contact surface not in contact with the substrate 5 is formed at an inner periphery of the polishing member 32. Further, the polishing member 32 is formed such that an area of the contact surface (bottom surface) of the polishing member 32 to be brought into contact with the substrate 5 is smaller than an area of an attachment surface (top surface) of the polishing member 32 to the base 31.

Further, a shape of the polishing member 32 may not be limited to the above example where the polishing member 32 has the reversed L-shaped cross sectional shape as long as the attachment surface of the polishing member 32 to the base 31 is larger than that of the contact surface with the substrate 5. By way of non-limiting example, the polishing member 32 may have a trapezoidal cross sectional shape that narrows downward. With this configuration, the area of the attachment surface of the polishing member 32 becomes larger. Accordingly, a pressure can be dispersed when the polishing member 32 comes into contact with the substrate 5, so that the polishing process can be performed more stably.

Figure 6:
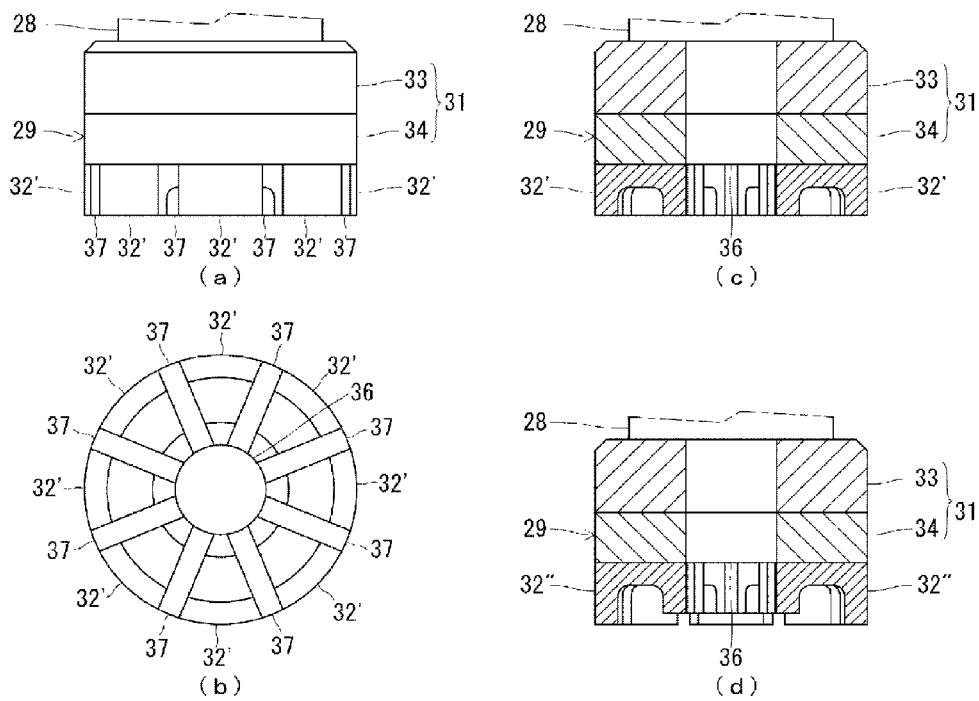
FIG. 6 provides a front view (a), a bottom view (b) and cross sectional views (c) and (d) illustrating another substrate processing scrubber.

Further, the polishing member 32 may not have only one contact surface with the substrate 5 but may have a multiple number of contact surfaces. By way of example, in a polishing member 32' shown in FIGS. 6(a) to 6(c), both an inner periphery and an outer periphery of the polishing member 32' are protruded downward. That is, the polishing member 32' has a reversed U-shaped cross sectional shape. Contact surfaces to be brought into contact with the substrate 5 are formed at the outer periphery and the inner periphery of the polishing member 32', respectively, and a non-contact surface is formed between the outer periphery and the inner periphery thereof. An area of the non-contact surface is set to be larger than an area of each of the contact surfaces. Thus, the pressure may be dispersed uniformly when the polishing member 32' comes into contact with the substrate 5. Heights of the downwardly protruding contact surfaces (i.e., a vertical difference between the contact surface and the non-contact surface (depth of the non-contact surface)) may be set to be a value that allows the protruding portions not to be deformed during the polishing process when the protruding portions come into contact with the substrate 5 while pressurized thereto. Further, base portions of the protruding shapes (i.e., boundaries between the contact surface and the non-contact surface) are rounded. Thus, required strength of the protruding portions can be obtained. The height of the contact surface of the outer periphery and the height of the contact surface of the inner periphery may be set to be same. Alternatively, the height of the contact surface of the outer periphery may be set to be larger than that of the inner periphery, as illustrated in a polishing member 32" shown in FIG. 6(d). Since the rotational speed of the outer periphery is faster than that of the inner periphery and the outer periphery works more effectively during the polishing process, by setting the height of the outer periphery to be larger than that of the inner periphery, the outer periphery is allowed to come into contact with the substrate 5 more securely, so that the substrate 5 can be processed more effectively.

The polishing scrubber 29 is connected to a processing liquid supply device 35 configured to supply a processing liquid toward the polishing member 32. The processing liquid supply device 35 supplies the processing liquid from a processing liquid supply source 54 toward the polishing members 32 via a processing liquid supply line 56 provided with a valve 55. The processing liquid is supplied toward the polishing members 32 through a processing liquid supply opening 36 formed at a central portion of the base 31. The processing liquid supply device 35 (valve 55) is connected to the controller 19, and the supply of the processing liquid is controlled by the controller 19. In the present illustrative embodiment, pure water for cooling frictional heat generated by the friction between the substrate 5 (removal target) and the polishing members 32 is used as the processing liquid.

The polishing scrubber 29 includes the multiple number of the polishing members 32 provided at the lower portion of the base 31 such that the polishing members 32 are arranged at the regular distance along the rotational direction thereof. In this configuration, radial gaps are formed between the adjacent polishing members 32. These gaps allow the processing liquid supply opening 36 formed at the central portion of the base 31 to communicate with the outside of the outer periphery of the polishing members 32. Thus, the gaps serve as liquid drain grooves 37 through which the processing liquid supplied from the processing liquid supply opening 36 is discharged out toward the outside of the polishing members 32.

Figure 7:
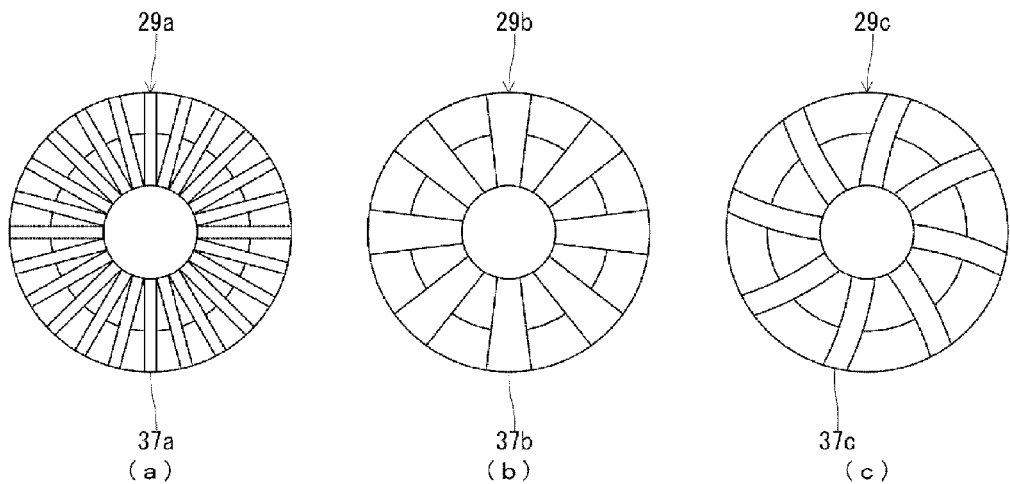
FIG. 7 is a bottom view illustrating still another substrate processing scrubber.

As stated above, in the polishing scrubber 29, by forming the liquid drain grooves 37 from a central portion of the base 31 toward the outside in a radial direction, the processing liquid can be drained effectively. Further, as depicted in FIG. 7(a), a polishing scrubber 29a may have a greater number of (here, twenty four) the polishing members 32, and, thus, have a greater number of liquid drain grooves 37a. With this configuration, the processing liquid can be discharged out more effectively. Further, in the polishing process, as a frequency of the contact between corners of the polishing members and the removal target increases, removing efficiency can be improved. Thus, by providing the greater number of polishing members 32, the number of the corners of the polishing members 32 is increased, and, as a result, the frequency of the contact with the removal target increases. As a consequence, the removal target can be rapidly removed. Furthermore, as depicted in FIG. 7(b), a polishing scrubber 29b may have liquid drain grooves 37b of which widths are increased from the central portion of the base 31 toward the outer peripheral end thereof. Further, as shown in FIG. 7(c), a polishing scrubber 29c may have liquid drain grooves 37c that are curved in the rotational direction of the base 31. With these configurations, the processing liquid can be drained more effectively.

The rinse liquid supply unit 17 includes, as illustrated in FIGS. 2 and 3, a rinse liquid supply nozzle 39 and a rinse liquid supply device 38 configured to supply the rinse liquid to the rinse liquid supply nozzle 39. The rinse liquid supply device 38 supplies the rinse liquid through a rinse liquid supply line 59 provided with a valve 58 from a rinse liquid supply source 57. A leading end of the rinse liquid supply nozzle 39 is oriented toward a central portion of the substrate 5. The rinse liquid supply device 38 (valve 58) is connected to the controller 19 and the supply of the rinse liquid is controlled by the controller 19.

Referring to FIGS. 2 and 3, the substrate cleaning unit 18 includes an arm 41 disposed above the substrate 5. The arm 41 is configured to be movable along the straight line-shaped guide rail 45 that is extended within the casing in a substantially horizontal manner. The arm 41 is connected to a scan driving device 40 configured to move the arm 41 in a substantially horizontal manner. The scan driving device 40 may include, for example, a ball screw and a motor configured to rotate the ball screw. By operating the scan driving device 40, the arm 41 can be moved above the substrate 5 held on the substrate holding unit 15. The scan driving device 40 is connected to and controlled by the controller 19.

Further, the substrate cleaning unit 18 also includes a substrate cleaning nozzle (two-fluid nozzle) 42 provided at a lower front end of the arm 41. The substrate cleaning nozzle 42 is connected to a cleaning fluid supply device 43. The cleaning fluid supply device 43 is configured to supply two kinds of fluids to the substrate cleaning nozzle 42 through cleaning fluid supply lines 64 and 65 provided with supply sources 60 and 61 and valves 62 and 63, respectively. The supply sources may supply two kinds of fluids such as pure water and nitrogen gas. The supplied two kinds of fluids are mixed to form a processing liquid in the substrate cleaning nozzle 42, and the processing liquid is supplied toward the substrate 5 from the substrate cleaning nozzle 42. The cleaning fluid supply device 43 (valves 62 and 63) is connected to the controller 19, and the supply of the processing liquid is controlled by the controller 19.

The substrate processing apparatus 1 has the above-described configuration and is controlled to perform a certain process on the substrate 5 by the controller 19 according to various programs stored on a storage medium 44 in the controller 19. Here, the storage medium 44 may store thereon various setup data and various programs such as a substrate processing program to be described below. The storage medium 44 may be formed by a known device, e.g., a memory such as a ROM or a RAM, or a disk-type storage medium such as a hard disk, a CD-ROM, a DVD-ROM or a flexible disk.

The substrate processing apparatus 1 is driven to polish the rear surface of the substrate 5 according to the substrate processing program stored on the storage medium 44 under the control of the controller 19, as will be described below.

First, the substrate transfer device 11 takes out the substrate 5 from the carrier 6 mounted on the substrate loading/unloading table 3 and transfers the substrate 5 into the substrate reversing unit 8. In the substrate reversing unit 8, the substrate 5 is turned upside down such that the rear surface thereof (opposite to the surface on which a circuit is to be formed) faces upward. Then, as shown in FIG. 3, the substrate transfer device 11 loads the substrate into the substrate processing unit 9 while the rear surface of the substrate 5 faces upward. The loaded substrate 5 is horizontally held by the substrate holding unit 15 within the substrate processing unit 9. At this time, the substrate 5 is mounted on the top portion of the substrate supporting bodies 23, and, then, by driving the opening/closing device 25 through the controller 19, the periphery of the substrate 5 is held by the substrate holding bodies 22.

Figure 8:
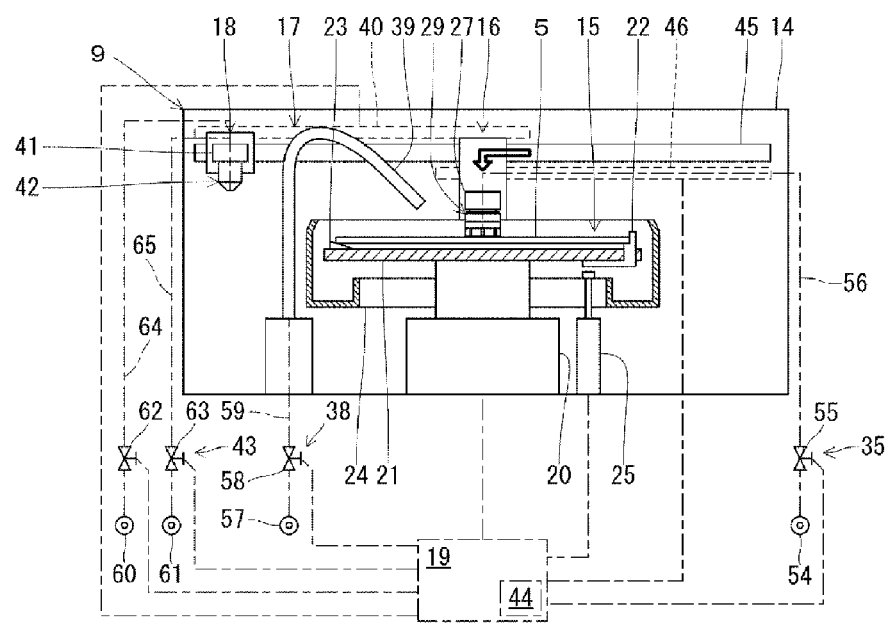
FIG. 8 is an operating diagram of the substrate processing apparatus.

Thereafter, as illustrated in FIG. 8, by driving the scan driving device 46 of the substrate polishing unit 16 through the controller 19, the polishing scrubber 29 is moved from a retreat position at a right side of the substrate 5 toward a process start position at the central portion of the substrate 5. Further, the substrate cleaning nozzle 42 of the substrate cleaning unit 18 stands by at a retreat position on a left side of the substrate 5.

Figure 9:
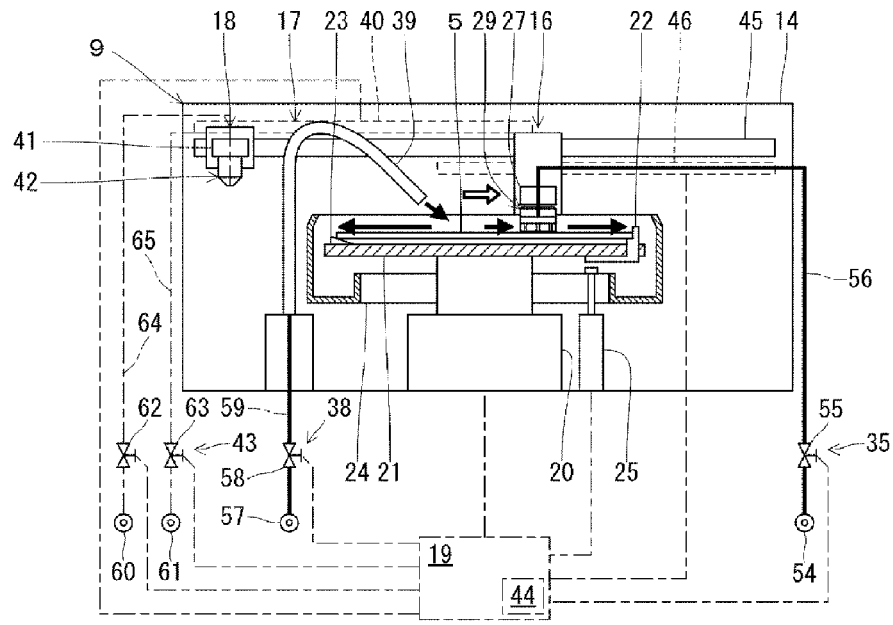
FIG. 9 is an operating diagram of the substrate processing apparatus.

Subsequently, as illustrated in FIG. 9, the rotation driving device 20 of the substrate holding unit 15 is driven by the controller 19, and the turntable 21 is rotated at a certain rotational speed while holding the substrate 5 thereon horizontally. Further, the scan driving device 46 and the scrubber rotation driving device 30 of the substrate polishing unit 16 are controlled by the controller 19. As a result, the polishing scrubber 29 is moved from a central portion of the rear surface of the substrate 5 toward a peripheral end thereof while rotated and pressurized against the rear surface of the substrate 5 at a certain pressure. At this time, by driving the processing liquid supply device 35 under the control of the controller 19, the processing liquid is supplied from the processing liquid supply opening 36 toward the polishing members 32 of the polishing scrubber 29. Further, by driving the rinse liquid supply device 38 of the rinse liquid supply unit 17 under the control of the controller 19, the pure water is supplied from the rinse liquid supply nozzle 39 toward the rear surface of the substrate 5.

Through the above operations, the polishing members of the polishing scrubber 29 are brought into contact with the removal target on the substrate 5, and peel the removal target off the substrate 5. The removed removal target is then removed from the substrate 5 by the processing liquid and the rinse liquid. The processing liquid supplied onto the substrate 5 is discharged out of the polishing scrubber 29 through the liquid drain grooves 37, and drained to the outside of the substrate 5 along with the rinse liquid by a centrifugal force of the substrate 5 that is rotating.

Here, when processing a certain range of an inner region of the substrate 5 with the polishing scrubber 29, by driving the processing liquid supply device 35 and the rinse liquid supply device 38 under the control of the controller 19, the processing liquid and the rinse liquid are supplied at preset flow rates, respectively. To elaborate, when processing an outer region of the substrate 5 than the certain range of the inner region thereof with the polishing scrubber 29, the supply of the rinse liquid is stopped or suppressed. That is, the flow rate of the processing liquid or the rinse liquid when processing the outer region of the substrate 5 is set to be smaller than the flow rate when processing the inner region thereof. When processing the inner region of the substrate 5 with the polishing scrubber 29, the processing liquid and the rinse liquid are smoothly drained to the outside of the substrate 5 by the centrifugal force of the substrate 5 that is rotating. When processing the outer region of the substrate 5 with the polishing scrubber 29, however, the flow of the rinse liquid on the substrate 5 may be disturbed by the polishing scrubber 29 at the outer periphery of the substrate 5. Accordingly, the processing liquid and the rinse liquid may not be smoothly discharged out to the outside of the substrate 5 but may flow onto the front surface of the substrate 5. To solve this problem, the flow rate of the processing liquid when processing the outer region of the substrate 5 with the polishing scrubber 29 is reduced as compared to the flow rate when processing the inner region of the substrate 5. By setting the flow rate of the processing liquid in this way, the flow of the rinse liquid may not be disturbed at the outer periphery of the substrate 5. Thus, the processing liquid and the rinse liquid can be smoothly discharged out to the outside of the substrate 5 while prevented from flowing onto the front surface of the substrate 5. Further, since the outer peripheral end of the substrate 5 is supported by the substrate supporting bodies 23 extended along the outer peripheral end of the substrate 5, the processing liquid and the rinse liquid can be more securely prevented from flowing onto the front surface of the substrate 5. Further, by supporting the outer peripheral end of the substrate 5 through the substrate supporting bodies 23 extended along the outer peripheral end of the substrate 5, the substrate 5 may not be easily deformed even when it is pressurized by the polishing scrubber 29. Thus, it is possible to perform the uniform process on the substrate.

Figure 10:
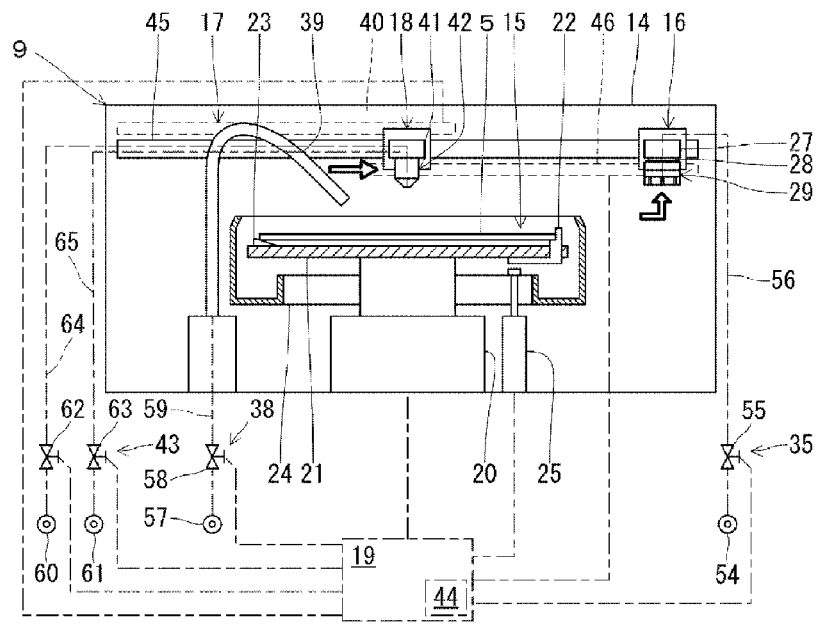
FIG. 10 is an operating diagram of the substrate processing apparatus.

Subsequently, as shown in FIG. 10, the operation of the rinse liquid supply device 38 of the rinse liquid supply unit 17 is stopped by the controller 19, and the supply of the rinse liquid (pure water) onto the rear surface of the substrate 5 from the rinse liquid supply nozzle 39 is stopped. Further, by driving the scan driving device 46 of the substrate polishing unit 16 under the control of the controller 19, the polishing scrubber 29 is moved to the retreat position at the right side of the substrate 5. Further, by driving the scan driving device 40 of the substrate cleaning unit 18, the substrate cleaning nozzle 42 is moved to a process start position at the central portion of the substrate 5 from the retreat position at the left side of the substrate 5.

Figure 11:
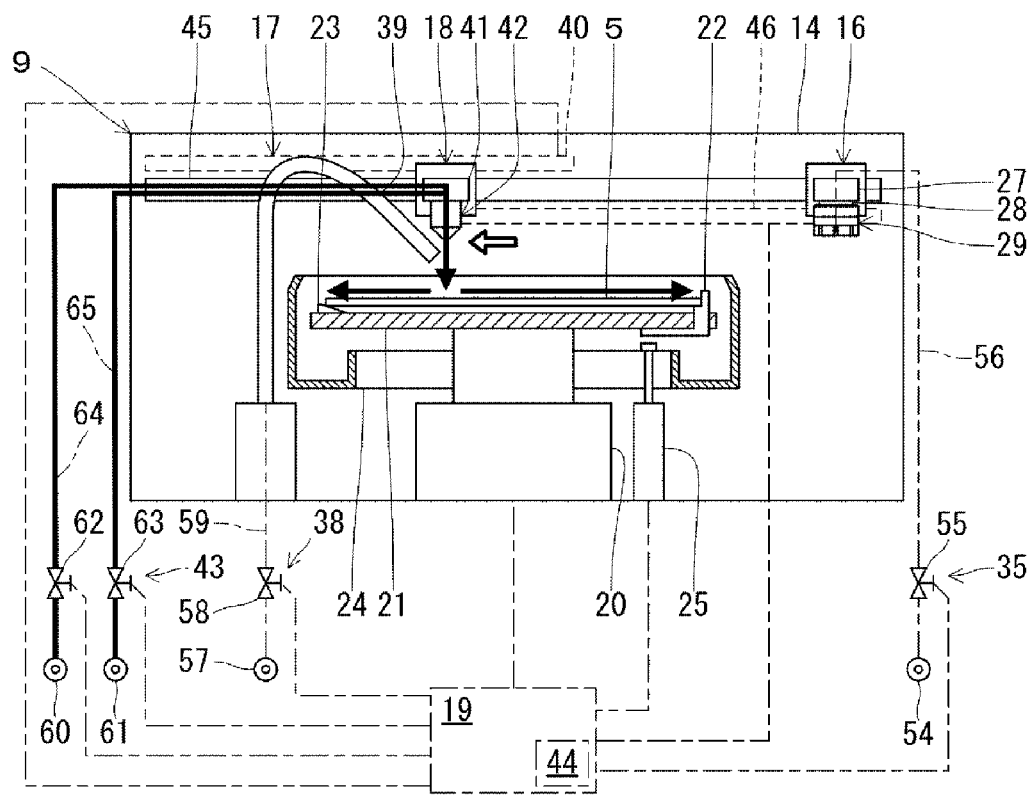
FIG. 11 is an operating diagram of the substrate processing apparatus.

Thereafter, as depicted in FIG. 11, by driving the scan driving device 40 and the cleaning fluid supply device 43 of the substrate cleaning unit 18 under the control of the controller 19, the substrate cleaning nozzle 42 is moved from the central portion of the rear surface of the substrate 5 toward the outer peripheral end thereof while supplying the processing liquid toward the substrate 5 from the substrate cleaning nozzle 42. Through these operations, the entire rear surface of the substrate 5 is cleaned by the substrate cleaning unit 18.

Afterward, as shown in FIG. 3, by driving the scan driving device 40 of the substrate cleaning unit 18 under the control of the controller 19, the substrate cleaning nozzle 42 is moved to the retreat position at the left side of the substrate 5. Thereafter, by rotating the substrate 5 continuously while holding the substrate 5 horizontally, the rear surface of the substrate 5 is dried. After completing the drying process, the rotation of the substrate 5 is stopped.

Then, the substrate 5 is unloaded from the top portion of the turntable 21 and loaded into the substrate reversing unit 8 by the substrate transfer device 11. In the substrate reversing unit 8, the substrate 5 is turned upside down such that the front surface thereof faces upward. Thereafter, the substrate transfer device 11 unloads the substrate 5 from the substrate reversing unit 8 and loads the substrate 5 into the carrier 6.

Through the above-described processes, the substrate processing apparatus 1 processes the substrate 5 (polishes the rear surface) according to the substrate processing program.

In the above-described substrate processing apparatus 1, the area of the attachment surface between the polishing member 32 and the base 31 is set to be larger than that of the contact surface between the polishing member 32 and the substrate 5. Accordingly, the pressure can be dispersed when the polishing member 32 comes into contact with the substrate 5. Thus, the polishing member 32 can be prevented from being inclined against the substrate 5 by the repulsive force from the substrate 5. Accordingly, the removal target can be effectively removed from the substrate 5. Especially, the outer periphery and the inner periphery of the polishing member 32 are formed to have the downwardly protruding shape. With this configuration, the contact surfaces to be brought into contact with the substrate 5 are formed at the inner periphery and the outer periphery of the polishing member 32, and the non-contact surface that does not come into contact with the substrate 5 is formed between the inner periphery and the outer periphery. Accordingly, when the polishing member 32 comes into contact with the substrate 5, the pressure can be dispersed effectively, so that the polishing member 32 can be further suppressed from being inclined against the substrate 5 by the repulsive force from the substrate 5. Moreover, by making the polishing member 32 come into contact with the substrate 5 at the two contact surfaces (at the inner periphery and the outer periphery), the polishing member 32 can be prevented from being inclined against the substrate 5 and the area of each contact surface can be reduced. Accordingly, the polishing process can be effectively performed. Furthermore, the polishing members 32 are provided at the base body 33 with the buffer body 34 having the lower rigidity than the polishing members 32 therebetween. With this configuration, the buffer body 34 attached to the polishing members 32 may be deformed. Accordingly, the polishing members 32 are allowed to efficiently move along the processing surface of the substrate 5.

What is claimed is:

1. A substrate processing scrubber for removing a removal target from a substrate, comprising:
   a base connected to a rotation shaft;
   scrubber main bodies provided at the base and arranged at a distance in a rotational direction of the base such that a gap is formed between adjacent scrubber main bodies; and
   a processing liquid supply opening formed within the base and configured to supply a processing liquid toward the scrubber main bodies,
   wherein an area of an attachment surface of each of the scrubber main bodies to be attached to the base is larger than an area of a contact surface of each of the scrubber main bodies to be brought into contact with the substrate,
   each of the scrubber main bodies includes an outer periphery having a downwardly protruding shape such that the contact surface of each of the scrubber main bodies is formed at the outer periphery, and
   a downwardly facing surface of each of the scrubber main bodies that is not in contact with the substrate is formed between the rotation shaft and the outer periphery at which said contact surface is formed.

2. The substrate processing scrubber of claim 1,
   wherein the base includes a base body connected to the rotation shaft; and a buffer body provided between the base body and each of the scrubber main bodies, and
   the base body is made of a rigid material and the buffer body is made of an elastic material having lower rigidity than that of the scrubber main bodies.

3. The substrate processing scrubber of claim 1,
   wherein each of the scrubber main bodies further includes an inner periphery having a downwardly protruding shape such that a cross section of each of the scrubber main bodies has a reversed U-shape and the contact surface of each of the scrubber main bodies is formed at the inner periphery and the outer periphery,
   the downwardly facing surface of each of the scrubber main bodies that is not in contact with the substrate is formed between the inner periphery and the outer periphery at which said contact surface is formed.

4. The substrate processing scrubber of claim 3,
   wherein an area of the downwardly facing surface of each of the scrubber main bodies is larger than that of the contact surface thereof.

5. The substrate processing scrubber of claim 1,
   wherein liquid drain grooves configured to discharge the processing liquid are formed between adjacent scrubber main bodies in the scrubber main bodies.

6. The substrate processing scrubber of claim 5,
   wherein each of the liquid drain grooves is formed from a rotation center of the base toward an outer peripheral portion thereof in a radial direction.

7. The substrate processing scrubber of claim 5,
   wherein a width of each of the liquid drain grooves is increased from a rotation center of the base toward an outer peripheral portion thereof.

8. The substrate processing scrubber of claim 5,
   wherein each of the liquid drain grooves is curved in the rotational direction of the base.

9. A substrate processing apparatus for removing a removal target from a substrate by using a substrate processing scrubber that is rotated,
   wherein the substrate processing scrubber comprises:
   a base connected to a rotation shaft;
   scrubber main bodies provided at the base and arranged at a distance in a rotational direction of the base such that a gap is formed between adjacent scrubber main bodies; and
   a processing liquid supply opening formed within the base and configured to supply a processing liquid toward the scrubber main bodies,
   wherein an area of an attachment surface of each of the scrubber main bodies to be attached to the base is larger than an area of a contact surface of each of the scrubber main bodies to be brought into contact with the substrate,
   each of the scrubber main bodies includes an outer periphery having a downwardly protruding shape such that the contact surface of each of the scrubber main bodies is formed at the outer periphery, and
   a downwardly facing surface of each of the scrubber main bodies that is not in contact with the substrate is formed between the rotation shaft and the outer periphery at which said contact surface is formed.

10. The substrate processing apparatus of claim 9,
    wherein an outer peripheral end of the substrate is supported by a substrate supporting body extended along the outer peripheral end of the substrate.

11. The substrate processing apparatus of claim 9, further comprising:
    a processing liquid supply device configured to supply the processing liquid from the processing liquid supply opening; and
    a controller configured to control a flow rate of the processing liquid supplied from the processing liquid supply device,
    wherein the controller is configured to control the processing liquid supply device such that the flow rate of the processing liquid when processing an outer region of the substrate with the substrate processing scrubber is smaller than the flow rate of the processing liquid when processing an inner region of the substrate with the substrate processing scrubber.

* * * * *

UNITED STATES PATENT AND TRADEMARK OFFICE
CERTIFICATE OF CORRECTION

| | |
|---|---|
| PATENT NO. | : 9,238,256 B2 |
| APPLICATION NO. | : 13/760249 |
| DATED | : January 19, 2016 |
| INVENTOR(S) | : Kurusu |

Page 1 of 1

It is certified that error appears in the above-identified patent and that said Letters Patent is hereby corrected as shown below:

In the specification,

Column 4, line 21, please add --11-- between "device" and "is".

Column 8, line 15, please add -- 14 -- between "casing" and "in".

Column 8, line 62, please add -- 5 -- between "substrate" and "into".

Column 9, line 30, please add -- 32 -- between "members" and "of".

Signed and Sealed this
Twenty-sixth Day of April, 2016

Michelle K. Lee
*Director of the United States Patent and Trademark Office*